US012764989B2

(12) United States Patent
Frey et al.

(10) Patent No.: US 12,764,989 B2
(45) Date of Patent: Oct. 13, 2026

(54) FRINGE-GATED CASTELLATED FET

(71) Applicant: Northrop Grumman Systems Corporation, Falls Church, VA (US)

(72) Inventors: Kevin M. Frey, Windsor Mill, MD (US); Ken Nagamatsu, Gaithersburg, MD (US); Josephine Chang, Ellicott City, MD (US); Robert S. Howell, Silver Spring, MD (US)

(73) Assignee: Northrop Grumman Systems Corporation, Virginia (VA)

(*) Notice: Subject to any disclaimer, the term of this patent is extended or adjusted under 35 U.S.C. 154(b) by 1022 days.

(21) Appl. No.: 17/702,334

(22) Filed: Mar. 23, 2022

(65) Prior Publication Data

US 2023/0307533 A1 Sep. 28, 2023

(51) Int. Cl.

| | |
|---|---|
| ***H10D 30/47*** | (2025.01) |
| ***H10D 30/01*** | (2025.01) |
| ***H10D 62/815*** | (2025.01) |
| ***H10D 62/824*** | (2025.01) |
| ***H10D 62/85*** | (2025.01) |

(Continued)

(52) U.S. Cl.

CPC ....... *H10D 30/4738* (2025.01); *H10D 30/015* (2025.01); *H10D 62/8164* (2025.01); *H10D 62/824* (2025.01); *H10D 62/8503* (2025.01); *H10D 64/01* (2025.01); *H10D 64/411* (2025.01)

(58) Field of Classification Search

None

See application file for complete search history.

(56) References Cited

U.S. PATENT DOCUMENTS

| | | | |
|---|---|---|---|
| 6,265,256 | B1 | 7/2001 | An et al. |
| 7,623,366 | B2 | 11/2009 | Park et al. |
| 7,936,600 | B2 | 5/2011 | Kang et al. |

(Continued)

FOREIGN PATENT DOCUMENTS

| | | | |
|---|---|---|---|
| JP | 2007173822 | A | 7/2007 |
| KR | 20110108089 | A | 10/2011 |
| TW | 202016977 | A | 5/2020 |

OTHER PUBLICATIONS

Translated Korean Office Action Corresponding to Application No. 10-2023-0007251 on Sep. 9, 2024.

(Continued)

*Primary Examiner* — Anthony Ho

(74) *Attorney, Agent, or Firm* — Dority & Manning, P.A.

(57) ABSTRACT

A field effect transistor, comprising: a substrate and a superlattice of stacked conducting channels on the substrate; a source and a drain spaced-apart from each other on the superlattice; alternating castellations and trenches formed in the superlattice between the source and the drain, wherein the castellations have sidewalls that cut-down through the superlattice to form the trenches and edges of the stacked conducting channels that terminate at the sidewalls; a fringe field dielectric that fills lower volumes of the trenches up to a height on the sidewalls that is higher than first edges of first conducting channels among the stacked conducting channels, such that the fringe field dielectric is adjacent to the first edges; and a gate electrode overlaying the fringe field dielectric and the castellations such that the gate electrode is not adjacent to the first edges.

20 Claims, 11 Drawing Sheets

(51) Int. Cl.
*H10D 64/01* (2025.01)
*H10D 64/27* (2025.01)

(56) References Cited

U.S. PATENT DOCUMENTS

| | | | | |
|---|---|---|---|---|
| 9,773,897 | B2 | 9/2017 | Nechay et al. | |
| 10,325,982 | B1 * | 6/2019 | Chang | H10D 30/63 |
| 2007/0145495 | A1 | 6/2007 | Curello et al. | |
| 2011/0280066 | A1 | 11/2011 | Park et al. | |
| 2012/0108032 | A1 | 5/2012 | Yin et al. | |
| 2012/0139026 | A1 | 6/2012 | Nishihara | |
| 2012/0273747 | A1 | 11/2012 | Saitoh et al. | |
| 2016/0126340 | A1 | 5/2016 | Nechay et al. | |
| 2016/0155846 | A1 | 6/2016 | Chen et al. | |
| 2016/0293713 | A1 | 10/2016 | Nechay et al. | |
| 2020/0287024 | A1 | 9/2020 | Dewey et al. | |
| 2020/0365394 | A1 * | 11/2020 | Lu | H10D 62/8503 |
| 2020/0373384 | A1 | 11/2020 | Chang et al. | |

OTHER PUBLICATIONS

Chang et al., "The Super-Lattice Castellated Field-Effect Transistor: A High-Power, High-Performance RF Amplifier", IEEE Electron Device Letters, vol. 40, No. 7, Jul. 2019, 4 pages.

Middleton et al., "Thermal Transport in Superlattice Castellated Field Effect Transistors", IEEE Electron Device Letters, vol. 40, Issue 9, Jul. 2019, 4 pages.

Translated Taiwan Office Action Corresponding to Application No. 111141771 on Aug. 15, 2023.

* cited by examiner

FRINGE-GATED CASTELLATED FET

STATEMENT OF GOVERNMENTAL INTEREST

This invention was made with U.S. Government support under contract no. 17-R-0204 awarded by the U.S. Government. The U.S. Government has certain rights in the invention.

TECHNICAL FIELD

The present disclosure relates generally to transistor devices and more specifically to a field effect transistor (FET) device on a superlattice structure.

BACKGROUND

A superlattice castellated (SLC) field effect transistor (FET) (SLCFET) is a FET constructed on a superlattice of stacked two-dimensional electron gas ("2DEG") layers ("2DEGs"), which form conducting channels in the superlattice to carry sheets of current from a source to a drain of the SLCFET. In order to deplete-out and pinch-off the conducting channels, a series of fin/ridge-like structures alternating with trenches are etched into the superlattice between the source and the drain, forming "castellations," so named for their resemblance to a top profile of a castle wall. To control current in the 2DEGs, a conformal gate on the castellations and trenches applies a gate electric field from sidewalls of the castellation to the 2DEGs that are horizontally adjacent to the gate, which depletes all of the 2DEGs in the superlattice simultaneously from their edges adjacent to the sidewalls. Constructing a SLCFET with a relatively narrow trench width between adjacent castellations is desirable for certain applications; however, as the trench width is reduced, patterning of a conformal and uniformly sized gate within the trenches and on the castellation sidewalls becomes progressively more difficult.

SUMMARY OF THE INVENTION

A field effect transistor (FET) comprises a substrate and a superlattice of stacked conducting channels on the substrate, and a source and a drain spaced-apart from each other on the superlattice. The FET includes alternating castellations and trenches formed in the superlattice between the source and the drain. The castellations have sidewalls that cut-down through the superlattice to form the trenches and edges of the stacked conducting channels that terminate at the sidewalls. The FET further includes a fringe field dielectric (FFD) that fills lower volumes of the trenches up to a height on the sidewalls that is higher than first edges of first conducting channels among the stacked conducting channels, such that the fringe field dielectric is adjacent to first edges. The FET also includes a gate electrode overlaying the fringe field dielectric and the castellations such that the gate electrode is not adjacent to the first edges. The FET may be configured as a SLCFET, for example.

Example embodiments of the invention are described below with reference to the following drawing figures, in which like reference numerals in the various figures are utilized to designate like components.

DESCRIPTION OF EXAMPLE EMBODIMENTS

Embodiments presented herein are directed to a SLCFET that includes alternating castellations and trenches formed in a superlattice of 2DEG layers ("2DEGs"), or alternatively, two-dimensional hole gas ("2DHG") layers ("2DHGs"). The trenches are at least partially filled with a fringe field dielectric, and a metal gate electrode overlays the castellations and the trenches that are at least partially filled with the fringe field dielectric. In a first embodiment, the trenches are only partially filled with the fringe field dielectric, leaving unfilled dips near tops of the trenches between the castellations, and the gate electrode fills the dips between the castellations to form a castellated gate electrode. In a second embodiment, the trenches are fully filled with the fringe field dielectric, and the gate electrode is planar.

In both embodiments, due to the fringe field dielectric at least partially filling the trenches, the gate electrode has a reduced topology compared to a "fully castellated" gate electrode of a conventional SLCFET. The term "topology" used in this context refers to a castellation depth of the gate electrode (i.e., a gate castellation depth). For only partially filled trenches, the gate castellation depth is the same as an upper trench depth that is unfilled by the fringe field dielectric, but filled by the gate electrode. For fully filled trenches, the gate castellation depth is zero. In contrast, the conventional "fully castellated" gate electrode fully fills the trenches due to the absence of the fringe field dielectric. In the ensuing description, the terms "castellated" and "undulating" may be used interchangeably.

The reduced topology of the gate electrode makes metallization of the gate electrode during fabrication much easier compared to fabrication of the fully castellated gate electrode of the conventional SLCFET. In turn, this increases manufacturability and yield, while decreasing cost, for fabricating the SLCFET with the reduced topology gate compared to fabricating the conventional SLCFET.

Figure 1:
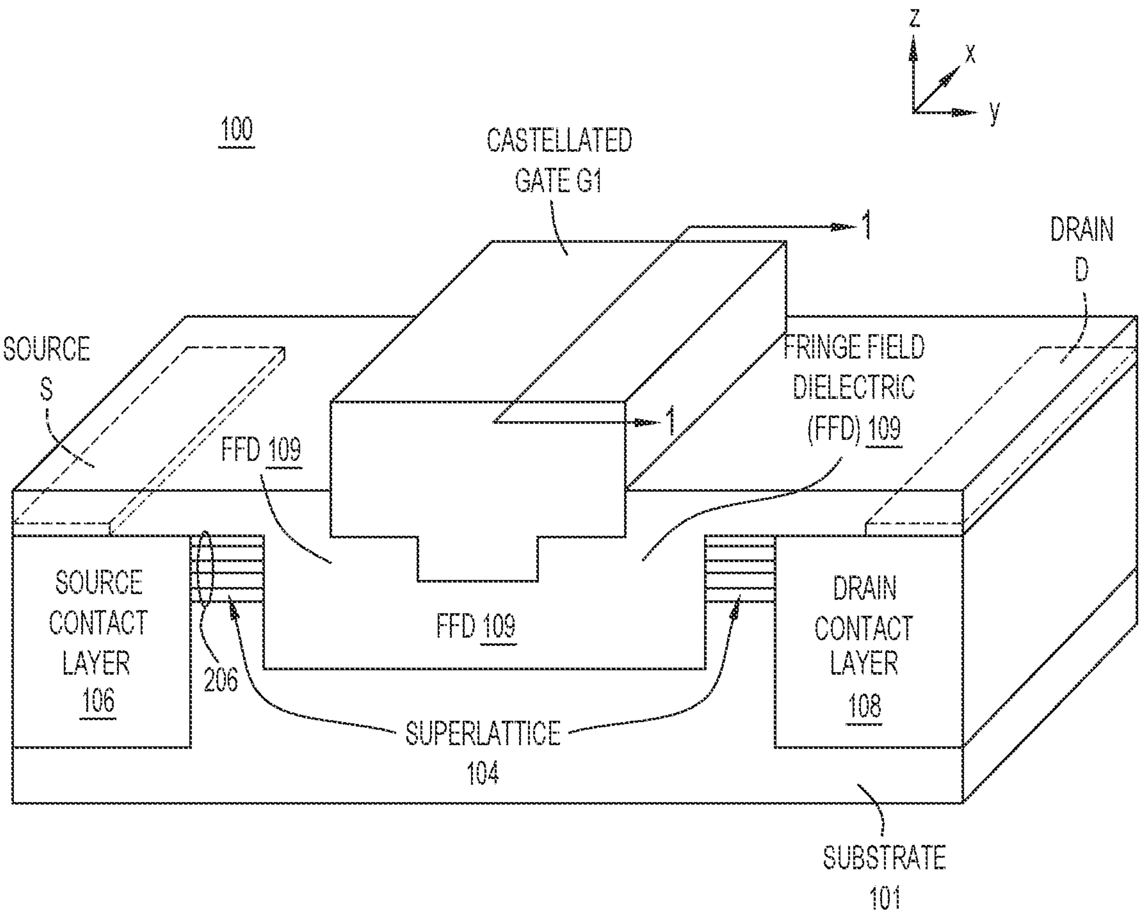
FIG. 1 is a perspective view of an example SLCFET constructed on a superlattice according to a first embodiment having only partially filled trenches.
Figure 2:
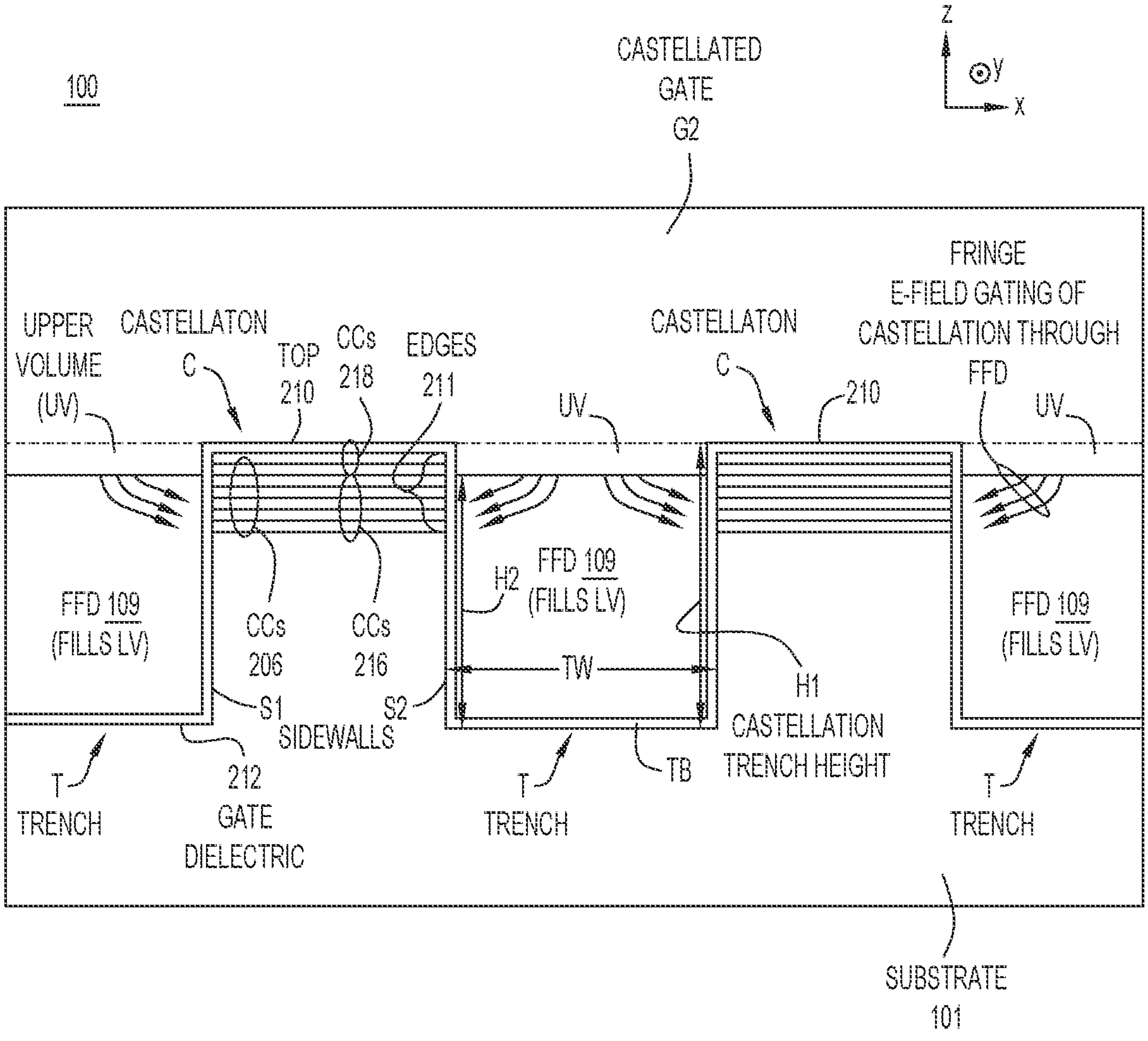
FIG. 2 is a cross-sectional view of the example SLCFET taken along the line 1-1 in FIG. 1.

Reference is now made primarily to FIGS. 1 and 2, which depict an example SLCFET 100, according to the first embodiment with only partially filled trenches. FIG. 1 is a perspective view of SLCFET 100 constructed on a superlattice structure. FIG. 2 is a cross-sectional view of SLCFET 100 taken along the line 1-1 in FIG. 1. SLCFET 100 includes a substrate layer 101 (also referred to as "substrate 101") and a superlattice of parallel, substantially planar, stacked conducting layers 104 (also referred to simply as "superlattice 104") on the substrate. Conducting layers 104 may comprise stacked 2DEGs or 2DHGs, for example. Substrate 101 may comprise any suitable substrate material including, but not limited to, Silicon Carbide (SiC), sapphire, and (111)-orientated crystalline silicon, for example, although other substrate materials are possible. The term "on" used herein with respect to a first layer being "on" a second layer means that the first layer is adjacent to, on top of, overlying, or covering the second layer, and may be either in direct contact, or not in direct contact, with the second layer (i.e. there may be one or more intervening layers between the first and the second layers). In the SLCFET example shown in FIGS. 1 and 2, substrate 101 and superlattice 104 are vertically stacked one on top of the other in a vertical or z-direction, and each layer is in contact with the underlying layer. Relative to the z-direction, an x-direction and a y-direction extend in horizontal directions transverse to each other. That is, the x- and y-directions together define a horizontal, or horizontally extending, x-y plane. In the example, the conducting channels of superlattice 104 are vertically stacked conducting channels that extend in parallel horizontal planes that are parallel to the x-y plane.

Figure 6:
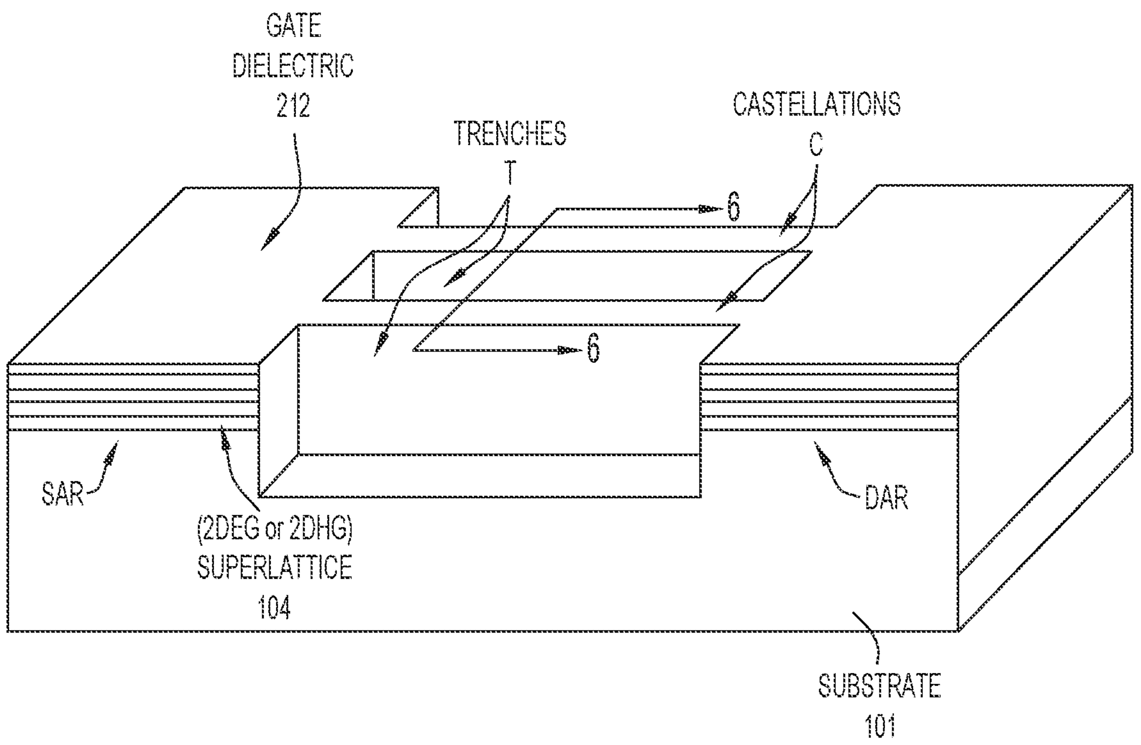
FIG. 6 is a perspective view of an example epitaxial structure formed in an initial stage of fabricating the example SLCFET of FIG. 1.
Figure 8:
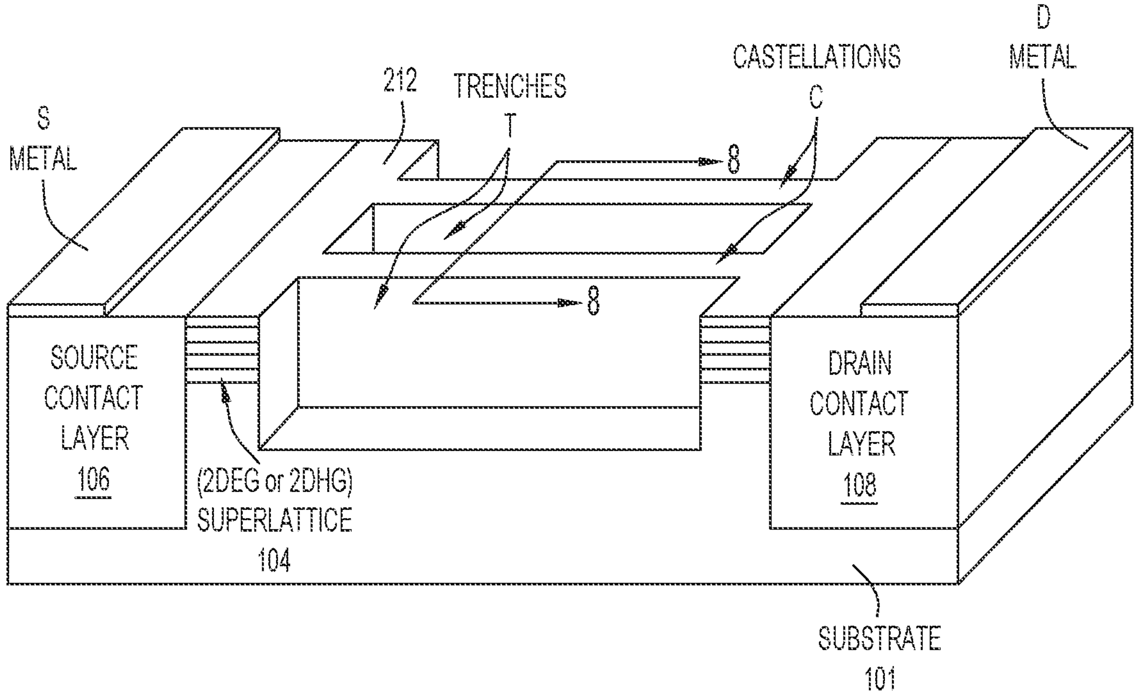
FIG. 8 is a perspective view of the example epitaxial structure of FIG. 6 after formation of source and drain contact layers, and deposition of source and drain metallization.

As shown in FIG. 1, SLCFET 100 includes a source (S) contact layer 106 and a drain (D) contact layer 108 respectively deposited on a source-access region SAR and a drain-access region DAR of superlattice 104 that are spaced spaced-apart from each other in the y-direction. Source contact layer 106 and drain contact layer 108 may comprise N+ Gallium Nitride (GaN) (N+ GaN), for example, although alternative conducting materials may be used. Source-access region SAR and drain-access region DAR, hidden from view in FIG. 1, are best seen in FIG. 6, described below in connection with a SLCFET fabrication process. SLCFET 100 also includes a metal source electrode S (also referred to as "source S") and a metal drain electrode D (also referred to as a "drain D") spaced-apart from each other in the y-direction and deposited on source contact layer 106 and drain contact layer 108, respectively. Source S and drain D are shown in dashed-line in FIG. 2 to indicate that they are positioned beneath an overlying fringe field dielectric (FFD) layer 109 (also referred to simply as an "FFD 109") described below. Source S and drain D are best seen in FIG. 8, described below in connection with the SLCFET fabrication process. Source S and drain D are in electrical contact with source-access region SAR and the drain-access region DAR through source contact layer 106 and drain contact layer 108, respectively.

As shown in FIG. 2, SLCFET 100 also includes alternating castellations or ridges C (also singularly referred to as a "castellation C") and trenches T (also singularly referred to as a "trench T") formed in (e.g., etched into) superlattice 104. Alternating castellations C and trenches T undulate across SLCFET 100 in the x-direction, and have respective non-undulating lengths that extend in the y-direction. Each castellation C provides a respective vertical stack of conducting channels (CCs) 206 (e.g., 2DEGs) of superlattice 104 through which current can flow from source S to drain D under control of a voltage applied to a gate voltage, described briefly above, and further below. Each castellation C may be referred to as a "multichannel" castellation or ridge. Further structural details of castellations C that result in conducting channels 206 are described below in connection with FIG. 5.

As shown in FIG. 2, castellations C are defined by respective pairs of opposing substantially vertical sidewalls S1 and S2 of the castellations that are spaced-apart from each other in the x-direction by a castellation width. Sidewalls S1, S2 cut-down through superlattice 104 from tops 210 of castellations C (i.e., from a top surface of superlattice 104) into substrate 101, to form trenches T between the sidewalls of adjacent castellations C. Trenches T each have a respective nadir or trench bottom TB embedded in substrate 101. Trenches T each have a respective trench width TW defined by a separation distance between adjacent castellations C (e.g., between a sidewall S1 of a first castellation and a sidewall S2 of a second castellation adjacent to the first castellation). In another embodiment, sidewalls S1, S2 may be tapered or sloped away from each other such that trenches T each has a trench width that gradually increases from the trench bottom to the top of the trench.

Sidewalls S1, S2 intersect with (stacked) sides or edges 211 of stacked conducting channels 206 that terminate at the sidewalls. That is, sidewalls S1, S2 sever stacked conducting channels 206 at their edges 211. Edges 211 extend in the y-directions along the lengths of castellations C. Sidewalls S1, S2 (and thus castellations C) have a full vertical height H1, which also represents a full trench depth, that extends from trench bottom TB to tops 210 of castellations C. SLCFET 100 optionally includes a thin gate dielectric layer 212 (also referred to as a "gate dielectric 212") (e.g., Silicon Nitride ($Si_3N_4$)) on superlattice 104. Gate dielectric 212 forms a thin conformal coating over castellations C (including sidewalls S1, S2) and lines trench bottoms TB. In addition to or in place of optional gate dielectric 212, SLCFET 100 includes FFD 109 (also referred to as a "volume dielectric") that only partially fills full lower volumes (depicted at "LV" in FIG. 2) of trenches T. In an arrangement in which gate dielectric 212 is omitted, FFD 109 serves as the gate dielectric in addition to other purposes described herein. FFD 109 may comprise a high-K dielectric, for example. FFD 109 may comprise $Si_3N_4$, Silica ($SiO_2$) Hafnium Oxide ($HfO_2$), and Aluminum Nitride (AlN), for example, although other high-K dielectric materials may be used. For example, FFD 109 fills lower volumes LV of trenches T (i.e., fills the lower volume of each trench) from their nadirs or trench bottoms TB up to a partial height H2 of sidewalls S1, S2 that is above or higher than at least some of conducting channels 206 (referred to as "first conduction channels 216" of the conducting channels) of castellations C. That is, FFD 109 fully fills a (lower) volume of each trench T given by TW×H2×length of trench (in y-direction). In this arrangement, FFD 109 is horizontally adjacent to and covers sidewalls S1, S2 from trench bottom(s) TB up to partial height H2. Thus, FFD 109 is horizontally adjacent to and covers first edges of first conducting channels 216, only. Conversely, FFD 109 does not fill upper volumes UV of trenches T that are stacked on top of lower volumes LV above partial height H2. Upper volumes UV of trenches T are horizontally adjacent to second edges of additional conducting channels (referred to as second conducting channels 218) of conducting channels 206 that are stacked on top of first conducting channels 216.

SLCFET 100 also includes metal gate electrode G1 (also referred to as "gate G1") that (i) fills upper volumes UV of trenches T that are left unfilled by FFD 109, and (ii) overlays tops 210 of castellations C. For example, gate G1 continuously overlays and is adjacent to top surfaces of FFD 109 in trenches T and tops 210 of castellations C, such that an undersurface of the gate is castellated/undulating across superlattice 104 in the x-direction. A portion of gate G1 that fills upper volumes UV of trenches T is horizontally adjacent to sidewalls S1, S2 above partial height H2, and is thus adjacent to and covers the second edges of second conducting channels 218. In contrast, FFD 109 physically blocks gate G1 from lower volumes LV of trenches T, such that the gate is not horizontally adjacent to the first edges of first conducting channels 216.

As best seen in FIG. 2, conformal gate dielectric 212 (*i*) coats superlattice 104 and bottoms of trenches T, and (ii) underlies FFD 109 and gate G1. That is, gate dielectric 212 is interposed between gate G1 and superlattice 104, and is interposed between FFD 109 and sidewalls S1, S2, and between trench bottoms TB and substrate 101.

The above-described configuration of SLCFET 100 results in the following operation. A gate voltage applied to gate G1 controls a flow of current in conducting channels 206 of castellations C from source S to drain D. More specifically, gate G1 generates an electric (e)-field responsive to the gate voltage, and subjects conducting channels 206 to the e-field, which controls or modulates (e.g., increases or decreases) the flow of current. Gate G1 applies a horizontally directed e-field only to the second edges of second (i.e., upper) conducting channels 218 that are above partial height H2 and horizontally adjacent to the gate, but not to the first edges of first (i.e., lower) conducting channels 216 that are below partial height H2 and therefore not horizontally adjacent to the gate. Instead, gate G1 applies a fringe e-field to first conducting channels 216 to control the current flow in those channels. The fringe e-field is directed from gate G1 downward, through FFD 109 occupying lower volumes LV of trenches T, to second conducting channels 216, as shown in FIG. 2. This is referred to as "fringe e-field gating" or simply "fringe gating" of the conducting channels within castellations C. From the perspective of gate G1, the fringe gating remotely modulates the flow of current in conducting channels 216 from source S to drain D.

Figure 3:
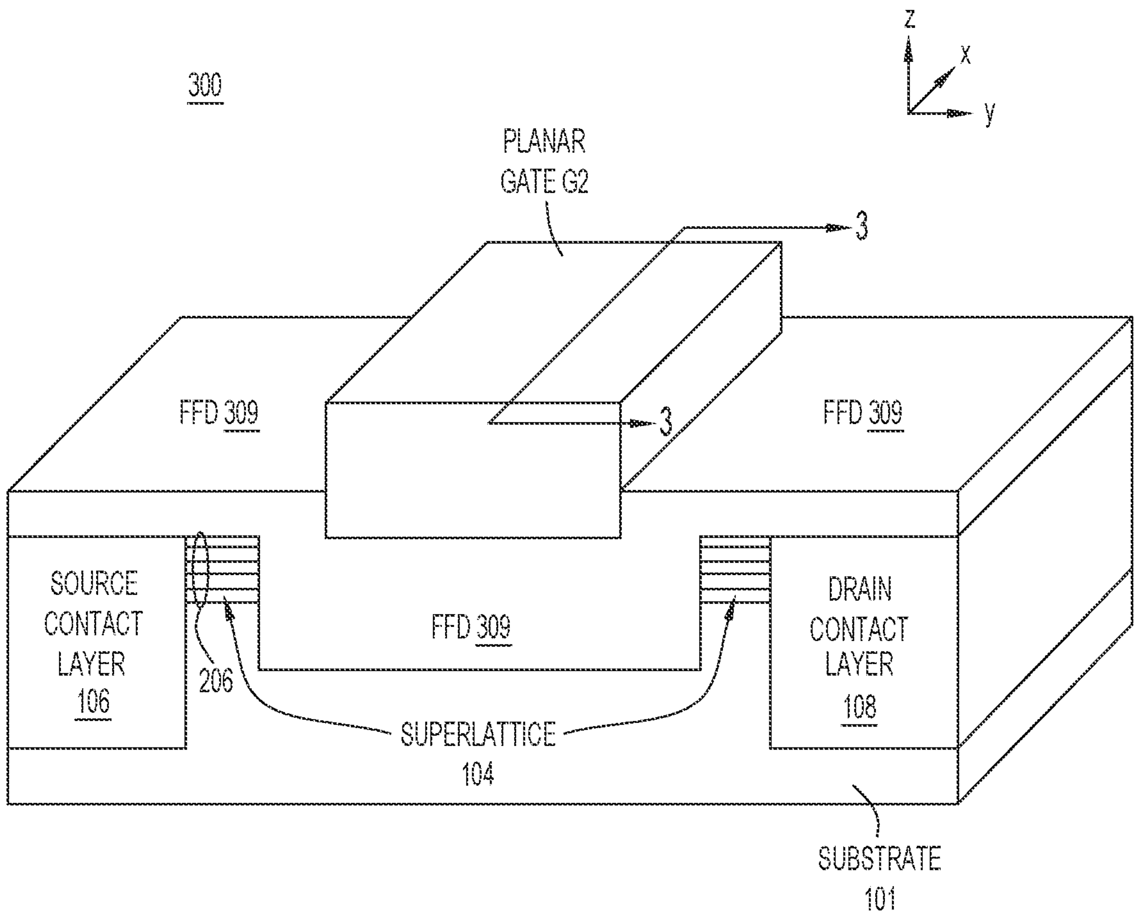
FIG. 3 is a perspective view of an example SLCFET constructed on the superlattice according to a second embodiment having fully filled trenches.
Figure 4:
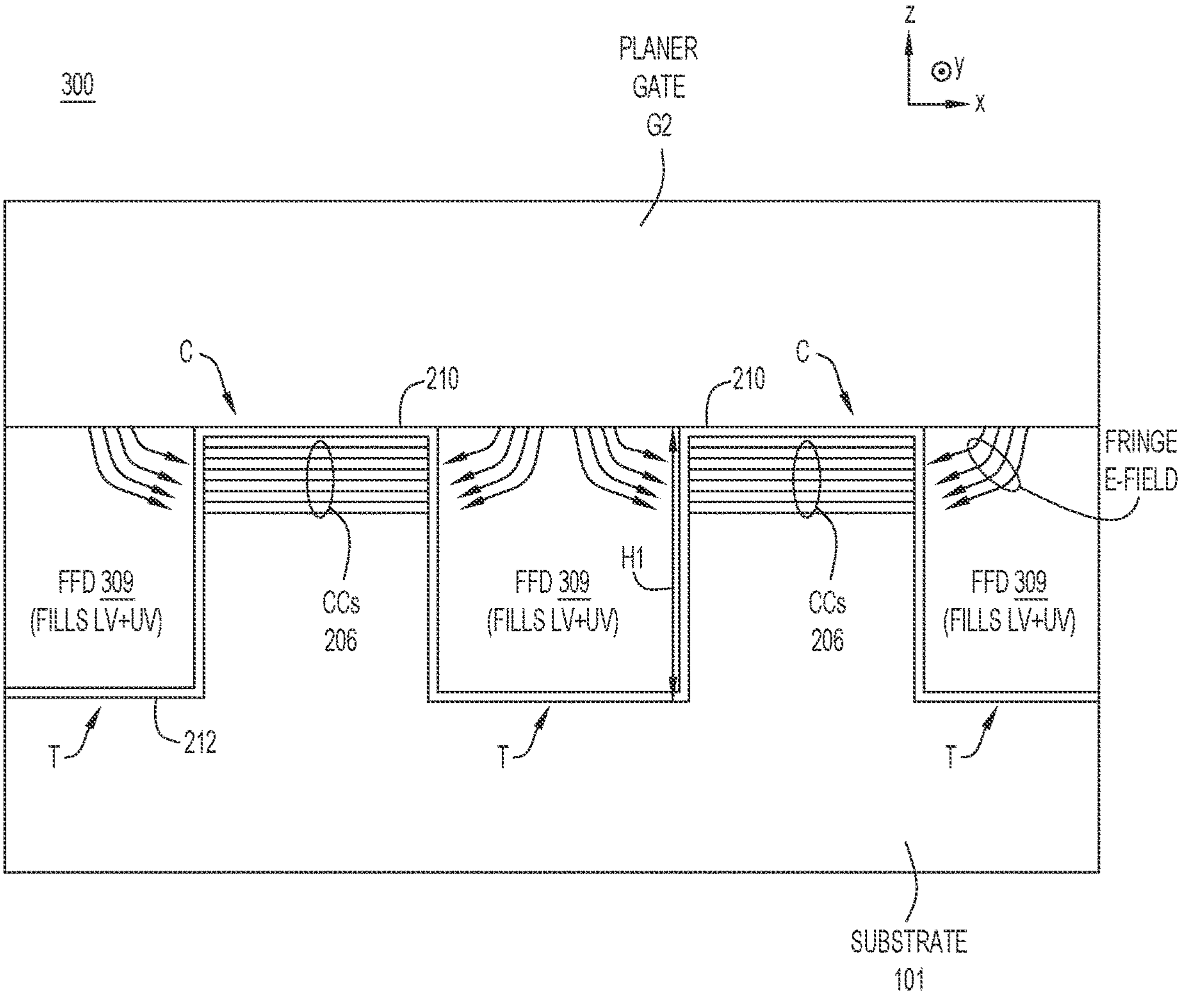
FIG. 4 is a cross-sectional view of the example SLCFET of FIG. 3 taken along the line 3-3 of FIG. 3.

Reference is now made to FIGS. 3 and 4, which depict an example SLCFET 300, according to the second embodiment with fully or completely filled trenches. FIG. 3 is a perspective view of SLCFET 300 constructed on superlattice 104. FIG. 4 is a cross-sectional view of SLCFET 300 taken along the line 3-3 in FIG. 3. SLCFET 300 is similar to SLCFET 100, except for the following main differences. In SLCFET 300, FFD 309 completely fills trenches T. For example, FFD 309 fills the full volumes of trenches T from their trench bottoms TB up to full height H1 of sidewalls S1, S2, so that the FFD is flush or level with tops 210 of castellations C. That is, FFD 309 completely fills lower volumes LV and upper volumes UV of each of trenches T.

In addition, a gate G2 overlays FFD 309 (i.e., the top surface of the FFD) and tops 210 of castellations C, to form a planar gate across the top surface of superlattice 104. For example, a lower surface of gate G2 overlaying/adjacent to FFD 309 and castellation tops 210 is planar. In this arrangement, only FFD 309 is horizontally adjacent to and covers the edges of all conducting channels 206 down sidewalls S1, S2 of castellations C. In contrast, gate G2 is not horizontally adjacent to any of the edges of conducting channels 206, due to the physical blocking effect of FFD 309. Accordingly, responsive to a gate voltage applied to gate G2, the gate applies only a fringe e-field to all conducting channels 206 down through FFD 309 fully occupying trenches T, as shown in FIG. 4. In an alternative arrangement in which gate dielectric 212 is omitted and replaced by FFD 309, the FFD may directly contact sidewalls S1, S2 and trench bottoms TB. Moreover, the planar configuration of gate G2 avoids direct contact between the gate and sidewalls S1, S2 with or without the gate dielectric. Omitting gate dielectric 212 does not change or diminish the effectiveness of the fringe e-field, but advantageously simplifies and thus streamlines construction of SLCFET 300.

Figure 5:
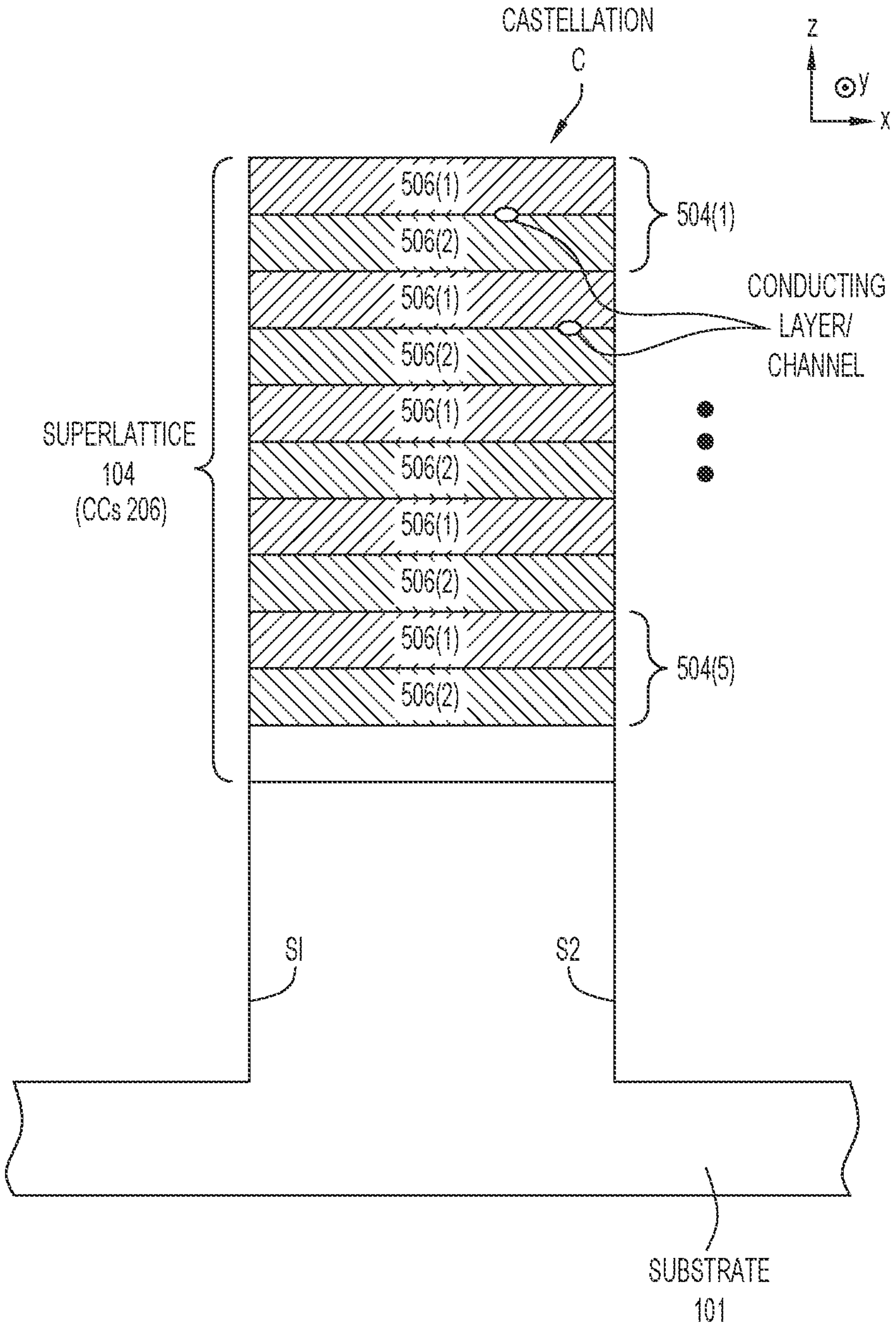
FIG. 5 is a cross-sectional view of an example castellation of the SLCFET of FIG. 1 or the SLCFET of FIG. 3 that shows heterostructures of the superlattice.

With reference to FIG. 5, there is a detailed cross-sectional view of a castellation C that shows structural details of superlattice 104 used to form the conducting channels of the castellation. As shown in FIG. 5, superlattice 104 includes multiple parallel heterostructures 504(1)-504(5) (collectively referred to as "heterostructures 504") overlying one another in a z-direction along a height of the superlattice to form a vertical stack of horizontal (parallel) heterostructures on substrate 101. Each heterostructure forms a corresponding one of the above-mentioned parallel, substantially planar, conducting layers or sheets of superlattice 104. The conducting layers are constrained in width by sidewalls S1, S2 of castellation C to form the conducting channels of the castellation. Each heterostructure 504(*i*) respectively includes a first layer 506(1) and a second layer 506(2) overlying the first layer to form a respective one of the conducting layers of the superlattice at an interface between the two layers. While a stack of 5 heterostructures are shown, it is understood that a stack of more or fewer heterostructures (and resulting superlattice layers) may be used. That is, superlattice 104 may include an arbitrary number of heterostructures.

In an example, first layer 506(1) of each heterostructure 504(*i*) comprises GaN, and second layer 506(2) of each heterostructure 504(*i*) comprises Aluminum Gallium Nitride (AlGaN); however, a variety of heterostructures may be employed as long as each heterostructure comprises two layers of dissimilar materials configured to create a sheet of electrons (i.e. a 2DEG layer) or a sheet of holes (i.e., a 2DHG layer) at the interface between the two dissimilar materials. Various additional heterostructure materials include, but are not limited to, Aluminum Gallium Arsenide (AlGaAs) and Gallium Arsenide (GaAs), Indium Aluminum Nitride (InAlN) and GaN, and alloys of Silicon (Si) and Germanium (Ge) overlying a base structure.

Figure 7:
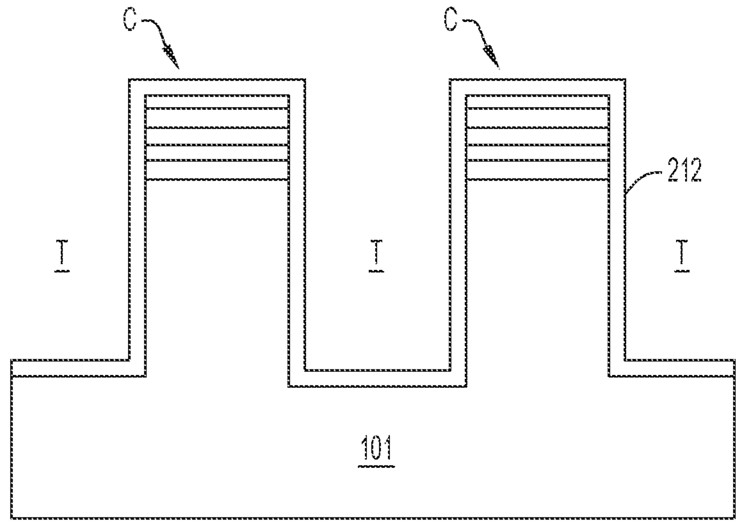
FIG. 7 is a cross-sectional view of the example epitaxial structure of FIG. 6 taken along the line 6-6.

An example process for fabricating SLCFET 100 (i.e., a SLCFET fabrication process) is now described in connection with FIGS. 6-15. FIGS. 6 and 7 are illustrations of an epitaxial structure formed in an initial or first fabrication stage. FIG. 6 is a perspective view of the epitaxial structure, while FIG. 7 is a cross-sectional view taken along line 6-6 in FIG. 6. The epitaxial structure includes superlattice 104 on substrate 101. The epitaxial structure includes heterostructure layers of superlattice 104 formed (e.g., deposited) on substrate 101 using successive applications of an epitaxial growth process. The growth process may include Metal Organic Chemical Vapor Deposition (MOCVD) or Molecular Beam Epitaxy (MBE), for example. Alternating castellations C and trenches T have been formed in the epitaxial structure. The castellations C and trenches T may be etched into the superlattice using Reactive Ion Etching (ME), for example. Additionally, gate dielectric 212 has been formed on a top surface of the epitaxial structure. Gate dielectric 212 may be deposited using low-pressure chemical vapor deposition (LPCVD), plasma-enhanced chemical vapor deposition (PECVD), or atomic layer deposition (ALD), for example. It is understood that gate dielectric 212 may be omitted in some arrangements, as described above.

Figure 9:
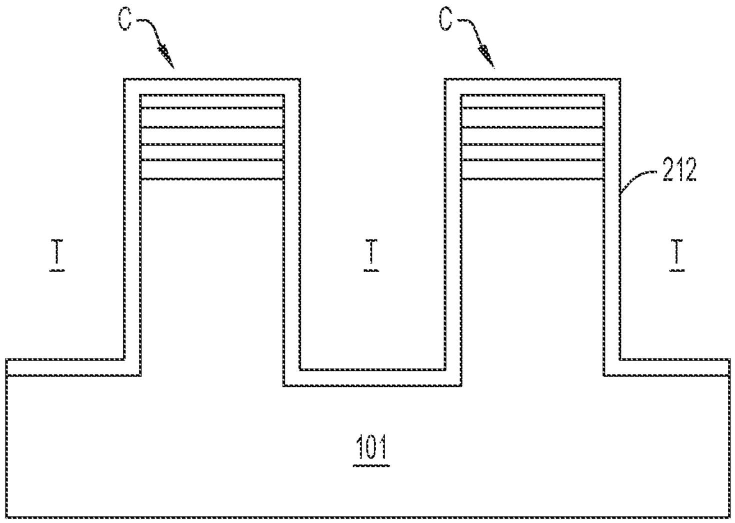
FIG. 9 is a cross-sectional view of the example epitaxial structure of FIG. 8 taken along the line 8-8.

FIGS. 8 and 9 are illustrations of the epitaxial structure after source contact layer 106, metal source S, drain contact layer 108, and metal drain D have been formed on the epitaxial structure of FIG. 6. FIG. 8 is a perspective view of the epitaxial structure, while FIG. 9 is a cross-sectional view of the epitaxial structure taken along the line 8-8. Source S and drain D may be formed using electron beam lithography, metal deposition by reactive direct current (DC) or radio frequency (RF) sputtering, thermal evaporation, and liftoff, for example.

Figure 10:
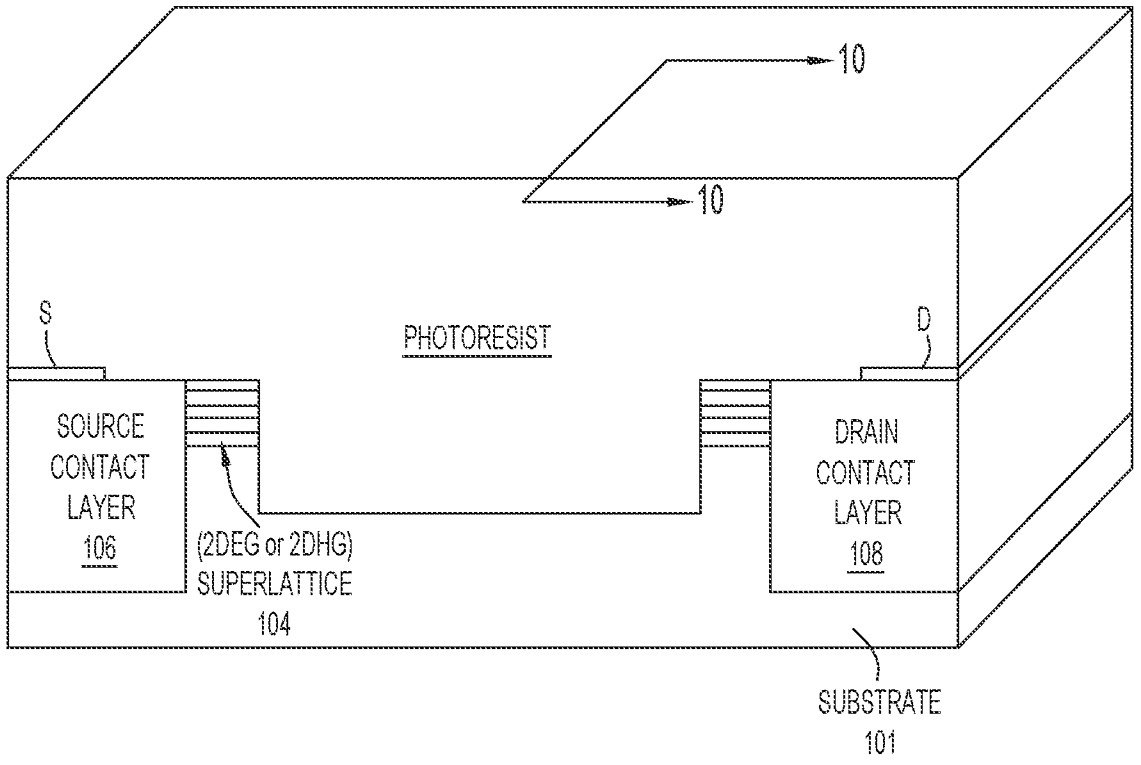
FIG. 10 is a perspective view of the example epitaxial structure of FIG. 8 after photoresist has been applied to define a gate electrode.
Figure 11:
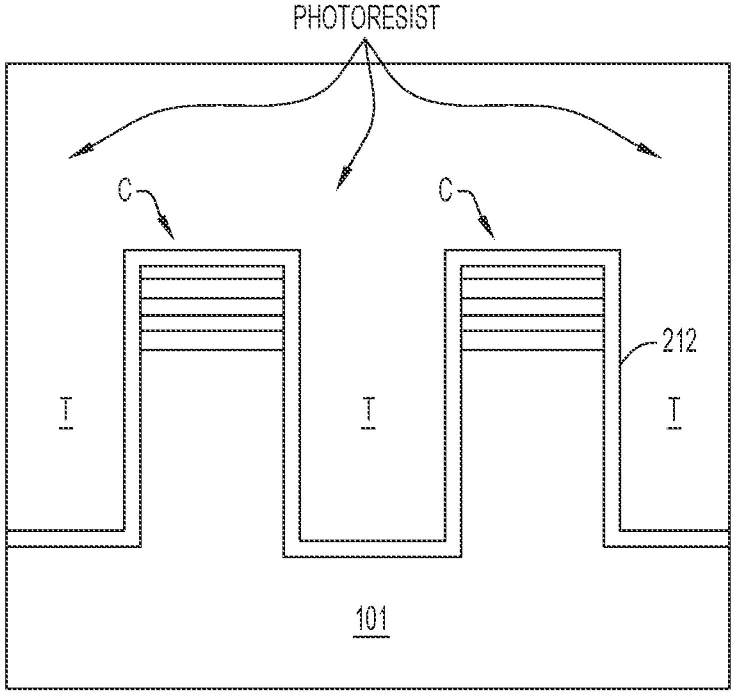
FIG. 11 is a cross-sectional view of the example epitaxial structure of FIG. 10 taken along the line 10-10.

FIGS. 10 and 11 are illustrations of the epitaxial structure after photoresist has been applied to the epitaxial structure of FIG. 9 to define the gate, e.g., gate G1. FIG. 10 is a perspective view of the epitaxial structure, while FIG. 11 is a cross-sectional view of the epitaxial structure taken along the line 10-10. The photoresist completely fills trenches T and overlay tops of castellations C. While FIGS. 10 and 11 depict the photoresist as a monolithic block, the photoresist may comprise multiple layers of photoresist.

Figure 12:
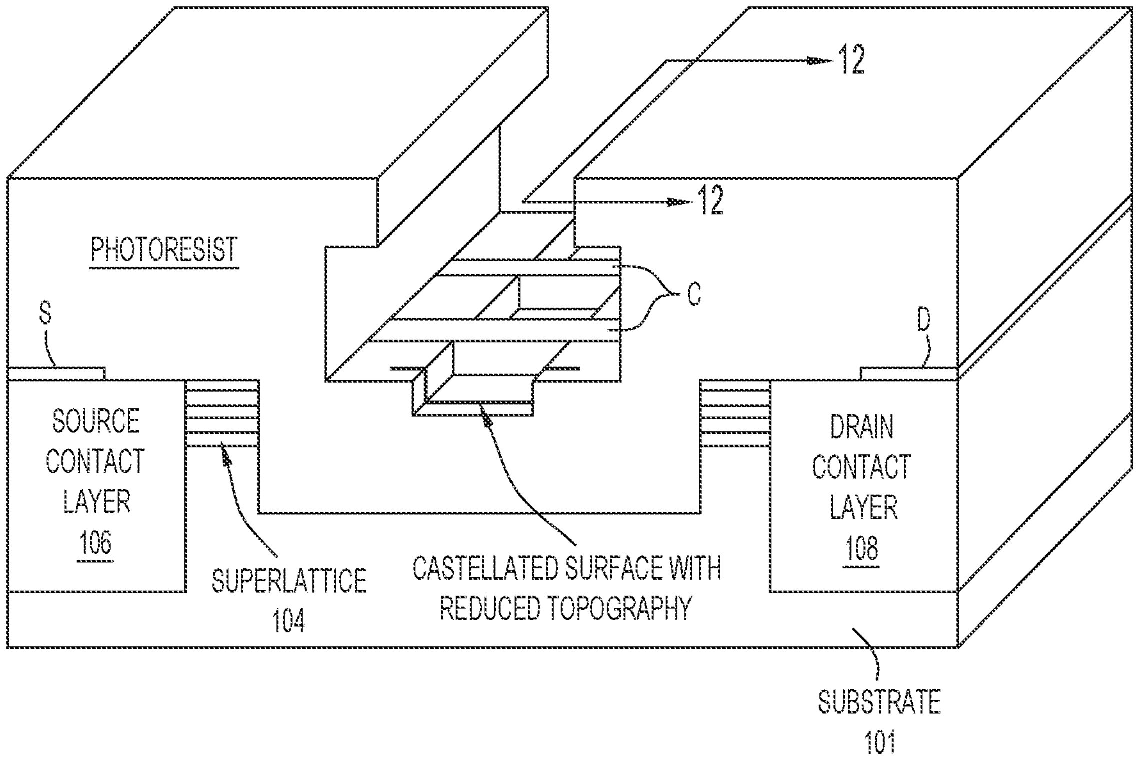
FIG. 12 is a perspective view of the example epitaxial structure of FIG. 10 after development of the photoresist for the gate electrode.
Figure 13:
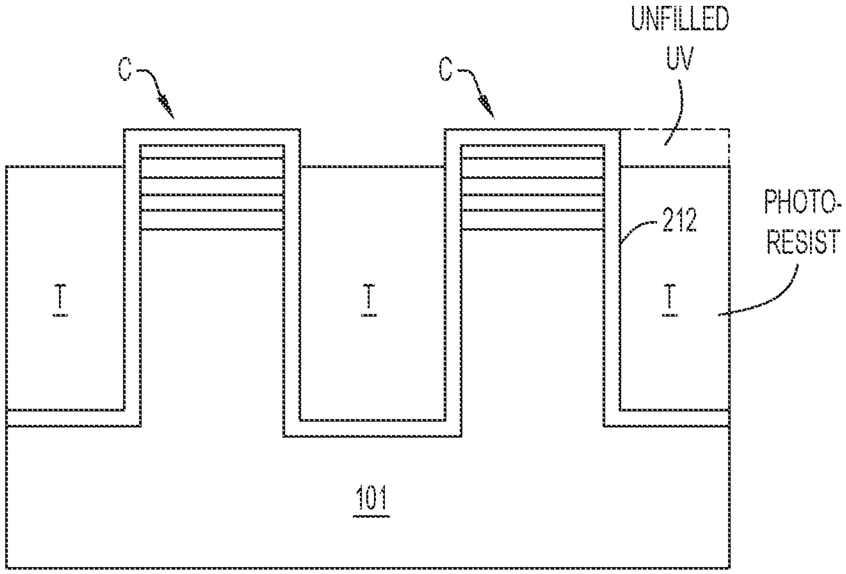
FIG. 13 is a cross-sectional view of the example epitaxial structure of FIG. 12 taken along the line 12-12.

FIGS. 12 and 13 are illustrations of the epitaxial structure after development of the photoresist of FIG. 10 for gate G1. FIG. 12 is a perspective view of the epitaxial structure, while FIG. 13 is a cross-sectional view of the epitaxial structure taken along the line 12-12. The etching defines a surface for gate G1 with a reduced topography. The etching may be performed using electron-beam lithography, for example.

Figure 14:
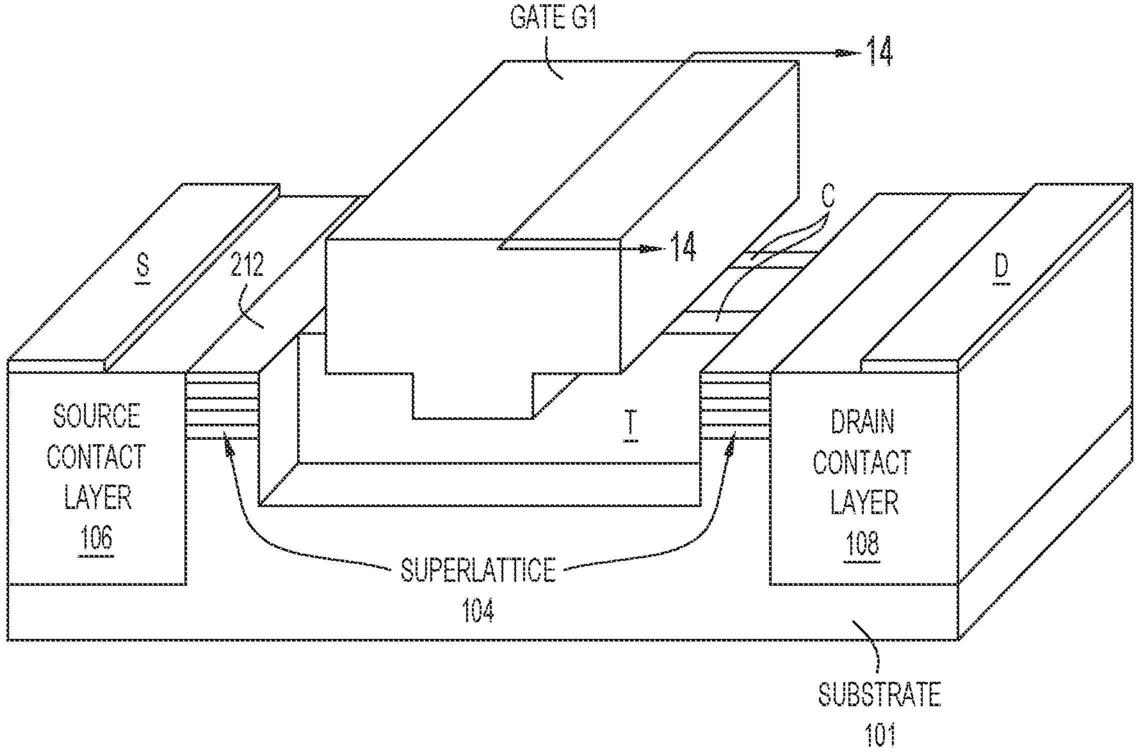
FIG. 14 is a perspective view of the example epitaxial structure of FIG. 12 after metal lift-off leaving the gate electrode.
Figure 15:
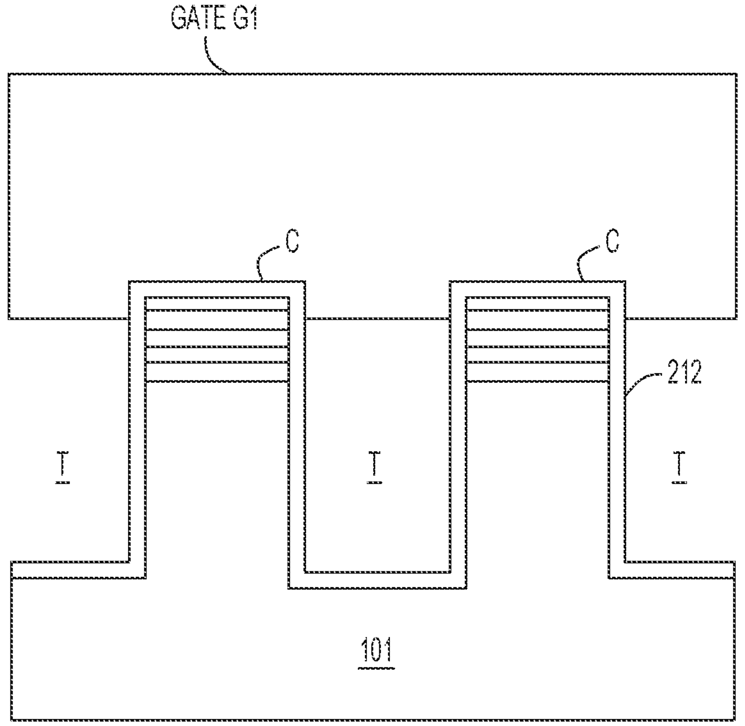
FIG. 15 is a cross-sectional view of the example epitaxial structure of FIG. 14 taken along the line 14-14.

FIGS. 14 and 15 are illustrations of the epitaxial structure after metal lift-off leaving gate G1 with reduced topography. FIG. 14 is a perspective view of the epitaxial structure, while FIG. 15 is a cross-sectional view of the epitaxial structure taken along the line 14-14. The reduced gate topography makes metallization of a uniformly wide gate across narrow trenches easier than when the gate topography is not reduced.

A next fabrication stage includes forming, e.g., by deposition, of FFD (layer) 109 on the epitaxial structure, to form the epitaxial structure shown in FIGS. 1 and 2, i.e., to form SLCFET 100.

The process for fabricating SLCFET 300 is similar to the process for fabricating SLCFET 100, except for the following differences. Etching of the photoresist (as shown in FIGS. 12 and 13) to define gate G2 leaves the full volumes of trenches T filled with the photoresist, rather than only lower volumes of the trenches filled with the photoresist. As a result, subsequent metal lift-off (as shown in FIGS. 14 and 15) leaves a planar gate (gate G2) with reduced topography, rather than a castellated or undulating gate. Finally, deposition of the FFD results in FFD layer 309.

The fabrication sequence described above in connection with FIGS. 6-15 is provided by way of example, only. It is understood that the fabrication sequence, i.e., order of fabrication stages, may be permuted in different embodiments, as would be appreciated by one of ordinary skill in the relevant arts having read the present description. For example, the fabrication sequence may form the FFD layer first, and then form the gate electrode, and so on.

Figure 16:
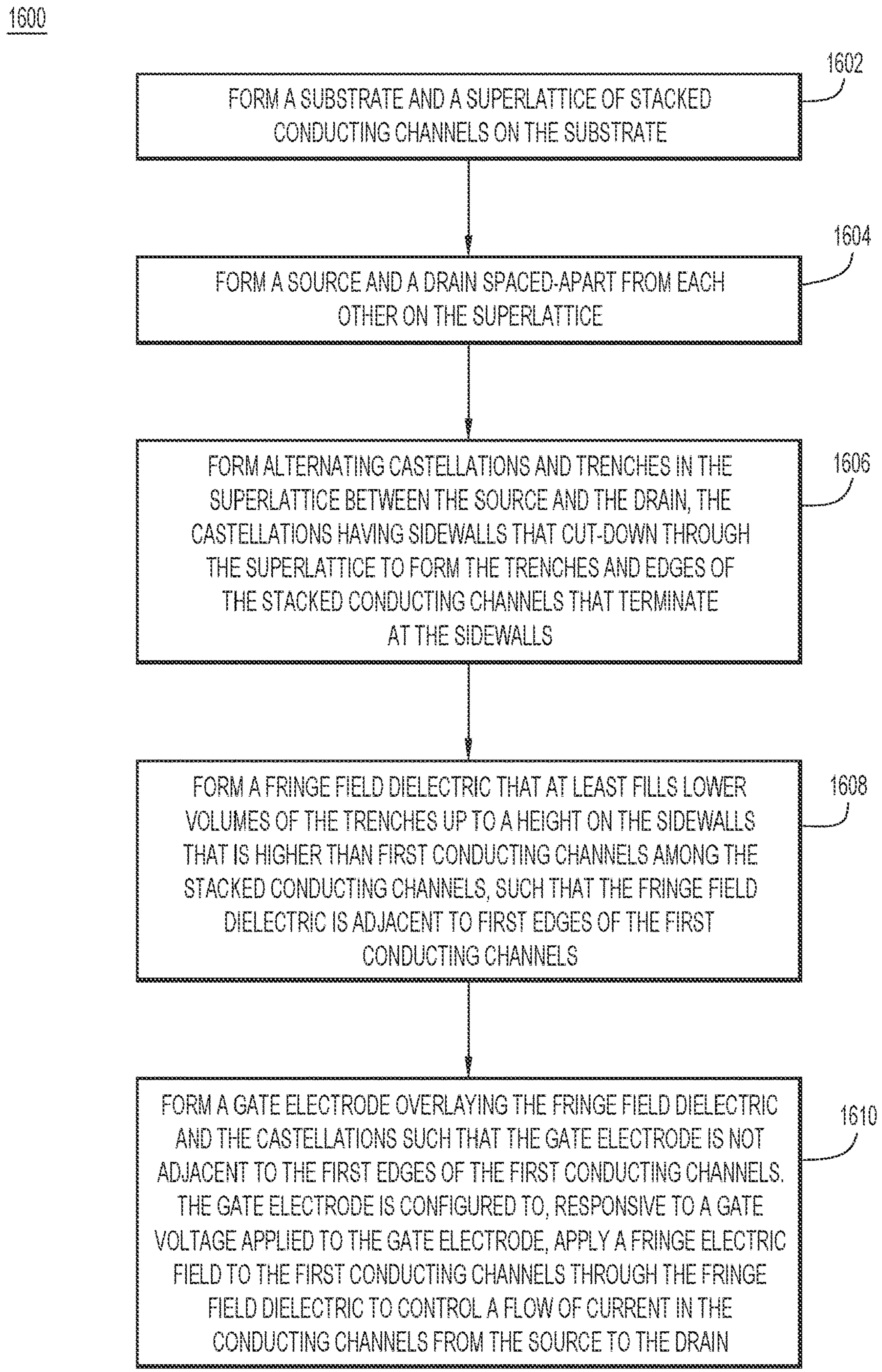
FIG. 16 is a flowchart of an example method of making the example SLCFET of FIG. 1 or FIG. 2.

With reference to FIG. 16, there is a flowchart of an example method 1600 of fabricating a SLCFET having a gate electrode with reduced topography. The order of fabrication operations of method 1600 is but one example, and may be permuted in other examples. Examples of the "forming" operations of method 1600 are described above in connection with FIGS. 6-15.

A fabrication operation 1602 includes providing a substrate and forming a superlattice of stacked conducting channels on the substrate. Forming operation 1602 may be performed as described above in connection with FIGS. 6 and 7, for example. The stacked conducting channels may be vertically stacked horizontally extending planar conducting channels, i.e., horizontal conducting channels that are stacked vertically.

A fabrication operation 1604 includes forming a source and a drain spaced-apart from each other on the superlattice. Forming operation 1604 may be performed as described above in connection with FIGS. 8 and 9, for example.

A fabrication operation 1606 includes forming alternating castellations and trenches in the superlattice between the source and the drain. Forming operation 1606 may be performed as described above in connection with FIGS. 6 and 7, for example. The castellations have sidewalls that cut-down through the superlattice to form the trenches and edges of the stacked conducting channels that terminate at the sidewalls.

A fabrication operation 1608 includes forming a fringe field dielectric that fills lower volumes of the trenches up to a height (e.g., a vertical height) on the sidewalls that is higher than first conducting channels among the stacked conducting channels (i.e., higher than first edges of the first conducting channels), such that the fringe field dielectric is adjacent to (e.g., horizontally adjacent to) the first edges of the first conducting channels. Forming operation 1608 may be performed as described above, for example.

A fabrication operation 1610 includes forming a gate electrode overlaying the fringe field dielectric and the castellations such that the gate electrode is not adjacent to the first edges of the first conducting channels. Forming operation 1610 may be performed as described above in connection with FIGS. 10-15, for example. The forming the gate electrode includes forming the gate electrode such that the gate electrode is configured to, responsive to a gate voltage applied to the gate electrode, apply a fringe electric field to the first conducting channels through the fringe field dielectric to control a flow of current in the conducting channels from the source to the drain.

In a first embodiment, the forming the forming the fringe field dielectric includes forming the fringe field dielectric to fill only the lower volumes of the trenches, leaving upper volumes or dips in the tops of the trenches unfilled by the fringe field dielectric. In this embodiment, the forming the gate electrode includes forming the gate electrode to fill the upper volumes of the trenches and to overlay tops of the castellations to form an undulating/castellated gate electrode across the superlattice. The forming the gate electrode further includes forming the gate electrode to fill the upper volumes of the trenches and to be adjacent to second edges of second conducting channels of the stacked conducting channels that are above/stacked on top of the first conducting channels.

In a second embodiment, the forming the fringe field dielectric includes forming the fringe field dielectric to fill full volumes of the trenches up to a height on the sidewalls that is flush with tops of the castellations, such that the fringe field dielectric is adjacent to the edges of all of the stacked conducting channels. In this embodiment, the forming the gate electrode includes forming the gate electrode to overlay the dielectric and tops of the castellations as a planar gate electrode across the superlattice.

In summary, in one aspect, a semiconductor device, e.g., a FET, is provided comprising: a substrate and a superlattice of stacked conducting channels on the substrate; a source and a drain spaced-apart from each other on the superlattice; alternating castellations and trenches formed in the superlattice between the source and the drain, wherein the castellations have sidewalls that cut-down through the superlattice to form the trenches and edges of the stacked conducting channels that terminate at the sidewalls; a fringe field dielectric that fills lower volumes of the trenches up to a height on the sidewalls that is higher than first edges of first conducting channels among the stacked conducting channels, such that the fringe field dielectric is adjacent to the first edges; and a gate electrode overlaying the fringe field dielectric and the castellations such that the gate electrode is not adjacent to the first edges.

In another aspect, a method of making a semiconductor device, e.g., a FET, is provided comprising: providing a substrate and forming a superlattice of stacked conducting channels on the substrate; forming a source and a drain spaced-apart from each other on the superlattice; forming alternating castellations and trenches in the superlattice between the source and the drain, the castellations having sidewalls that cut-down through the superlattice to form the trenches and edges of the stacked conducting channels that terminate at the sidewalls; forming a fringe field dielectric that fills lower volumes of the trenches up to a height on the sidewalls that is higher than first edges of the first conducting channels among the stacked conducting channels, such that the fringe field dielectric is adjacent to the first edges; and forming a gate electrode overlaying the fringe field dielectric and the castellations such that the gate electrode is not adjacent to the first edges.

The above description is intended by way of example only. The description is not intended to be exhaustive nor is the invention intended to be limited to the disclosed example embodiment(s). Many modifications and variations will be apparent to those of ordinary skill in the art without departing from the scope and spirit of the invention.

What is claimed is:

1. A field effect transistor, comprising:
- a substrate and a superlattice of stacked conducting channels on the substrate;
- a source and a drain spaced-apart from each other on the superlattice;
- alternating castellations and trenches formed in the superlattice between the source and the drain, wherein the castellations have sidewalls that cut-down through the superlattice to form the trenches and edges of the stacked conducting channels that terminate at the sidewalls;
- a fringe field dielectric that fills lower volumes of the trenches, the fringe field dielectric having a top surface within the trenches that is lower than a height of the trenches and higher than first edges of first conducting channels among the stacked conducting channels, such that the fringe field dielectric is adjacent to the first edges; and
- a gate electrode overlaying the fringe field dielectric and the castellations, the gate electrode having a lower surface within the trenches that is lower than the height of the trenches and higher than the first edges such that the gate electrode is not adjacent to the first edges.

2. The field effect transistor of claim 1, wherein responsive to a gate voltage applied to the gate electrode, the gate electrode is configured to apply a fringe electric field through the fringe field dielectric to the first conducting channels to control a flow of current in the stacked conducting channels from the source to the drain.

3. The field effect transistor of claim 1, wherein:
- the fringe field dielectric only fills the lower volumes of the trenches, leaving upper volumes of the trenches unfilled by the fringe field dielectric; and
- the gate electrode fills the upper volumes of the trenches and overlays tops of the castellations to form a castellated gate electrode across the superlattice.

4. The field effect transistor of claim 3, wherein:
- the gate electrode that fills the upper volumes of the trenches is adjacent to second edges of second conducting channels of the stacked conducting channels that are above the first conducting channels.

5. The field effect transistor of claim 1, wherein:
- the fringe field dielectric fills full volumes of the trenches up to a height on the sidewalls that is flush with tops of the castellations, such that the fringe field dielectric is adjacent to the edges of all of the stacked conducting channels; and
- the gate electrode overlays the fringe field dielectric and tops of the castellations to form a planar gate electrode across the superlattice.

6. The field effect transistor of claim 1, wherein:
- the stacked conducting channels are horizontal planar channels that are stacked vertically;
- the sidewalls of the castellations cut-down through the superlattice from a top surface of the superlattice to bottoms of the trenches, such that the height is a vertical height; and
- the fringe field dielectric is horizontally adjacent to the first edges of the first conducting channels.

7. The field effect transistor of claim 1, wherein the stacked conducting channels of the superlattice include two-dimensional electron gas (2DEG) layers or two-dimensional hole gas (2DHG) layers.

8. The field effect transistor of claim 1, wherein the superlattice comprises heterostructures that form the stacked conducting channels.

9. The field effect transistor of claim 8, wherein each heterostructure includes an Aluminum Gallium Nitride (AlGaN) layer and a GaN layer.

10. The field effect transistor of claim 1, further comprising a conformal gate dielectric layer that (i) coats the superlattice and bottoms of the trenches, and (ii) underlies the fringe field dielectric and the gate electrode.

11. The field effect transistor of claim 1, wherein the field effect transistor is configured as a superlattice castellated (SLC) field effect transistor (FET) (SLCFET).

12. A method of forming a field effect transistor, comprising:
- providing a substrate and forming a superlattice of stacked conducting channels on the substrate;
- forming a source and a drain spaced-apart from each other on the superlattice;
- forming alternating castellations and trenches in the superlattice between the source and the drain, the castellations having sidewalls that cut-down through the superlattice to form the trenches and edges of the stacked conducting channels that terminate at the sidewalls;
- forming a fringe field dielectric that fills lower volumes of the trenches, the fringe field dielectric having a top surface within the trenches that is lower than a height of the trenches and higher than first edges of first conducting channels among the stacked conducting channels, such that the fringe field dielectric is adjacent to the first edges; and forming a gate electrode overlaying the fringe field dielectric and the castellations, the gate electrode having a lower surface within the trenches that is lower than the height of the trenches and higher than the first edges such that the gate electrode is not adjacent to the first edges.

13. The method of claim 12, wherein forming the gate electrode includes forming the gate electrode such that the gate electrode is configured to, responsive to a gate voltage applied to the gate electrode, apply a fringe electric field to the first conducting channels through the fringe field dielectric to control a flow of current in the stacked conducting channels from the source to the drain.

14. The method of claim 12, wherein:

forming the fringe field dielectric includes forming the fringe field dielectric to fill only the lower volumes of the trenches, leaving upper volumes of the trenches unfilled by the fringe field dielectric; and forming the gate electrode includes forming the gate electrode to fill the upper volumes of the trenches and to overlay tops of the castellations to form a castellated gate electrode across the superlattice.

15. The method of claim 14, wherein:

forming the gate electrode further includes forming the gate electrode to fill the upper volumes of the trenches and to be adjacent to second edges of second conducting channels of the stacked conducting channels that are above the first conducting channels.

16. The method of claim 12, wherein:

forming the fringe field dielectric includes forming the fringe field dielectric to fill full volumes of the trenches up to a height on the sidewalls that is flush with tops of the castellations, such that the fringe field dielectric is adjacent to the edges of all of the stacked conducting channels; and forming the gate electrode includes forming the gate electrode to overlay the fringe field dielectric and tops of the castellations as a planar gate electrode across the superlattice.

17. The method of claim 12, further comprising:

forming the stacked conducting channels as vertically stacked, horizontal planar channels;

forming the sidewalls of the castellations to cut-down through the superlattice from a top surface of the superlattice to bottoms of the trenches, such that the height is a vertical height; and forming the fringe field dielectric to be horizontally adjacent to the first edges of the first conducting channels.

18. The method of claim 12, further comprising forming the stacked conducting channels of the superlattice as two-dimensional electron gas (2DEG) layers or two-dimensional hole gas (2DHG) layers.

19. The method of claim 12, further comprising forming the stacked conducting channels of the superlattice as two-dimensional electron gas (2DEG) layers or two-dimensional hole gas (2DHG) layers.

20. The method of claim 12, further comprising forming a conformal gate dielectric layer that (i) coats the superlattice and bottoms of the trenches, and (ii) underlies the fringe field dielectric and the gate electrode.

* * * * *